(12) United States Patent
Merenda (10) Patent No.: US 6,879,192 B2
(45) Date of Patent: Apr. 12, 2005

(54) EVEN HARMONIC MIXER WITH HIGH-INPUT, THIRD-ORDER INTERCEPT POINT

(75) Inventor: Joseph L. Merenda, Massapequa, NY (US)

(73) Assignee: L-3 Communications Corporation, New York, NY (US)

( * ) Notice: Subject to any disclaimer, the term of this patent is extended or adjusted under 35 U.S.C. 154(b) by 607 days.

(21) Appl. No.: 09/982,943

(22) Filed: Oct. 18, 2001

(65) Prior Publication Data

US 2003/0078027 A1 Apr. 24, 2003

(51) Int. Cl.[7] .............................. H04B 1/26; H04B 1/18
(52) U.S. Cl. ...................... 327/113; 455/326; 455/330; 455/293
(58) Field of Search ............................... 455/284, 293, 455/323, 326, 33–0; 327/113

(56) References Cited

U.S. PATENT DOCUMENTS

| | | | | |
|---|---|---|---|---|
| 3,665,508 A | * | 5/1972 | Gawler | 455/320 |
| 3,772,584 A | * | 11/1973 | Barley et al. | 327/113 |
| 3,983,489 A | * | 9/1976 | Gittinger | 455/331 |
| 4,747,160 A | | 5/1988 | Bossard | 455/60 |
| 4,823,400 A | * | 4/1989 | Dobrovolny | 455/326 |
| 5,003,622 A | * | 3/1991 | Ma et al. | 455/327 |
| 5,416,449 A | | 5/1995 | Joshi | 455/109 |
| 5,465,517 A | | 11/1995 | Tanbakuchi | 42/70.06 |
| 5,553,319 A | | 9/1996 | Tanbakuchi | 455/326 |
| 5,771,449 A | | 6/1998 | Blasing et al. | 455/1 |
| 5,787,126 A | | 7/1998 | Itoh et al. | 375/340 |
| 5,844,939 A | | 12/1998 | Scherer et al. | 455/76 |
| 5,875,396 A | | 2/1999 | Stockton et al. | 455/562 |
| 5,995,819 A | | 11/1999 | Yamaji et al. | 455/326 |
| 6,141,557 A | | 10/2000 | Dipiazza | 455/446 |
| 6,229,395 B1 | | 5/2001 | Kay | 330/252 |
| 2002/0102958 A1 | * | 8/2002 | Buer | 455/296 |

OTHER PUBLICATIONS

J.L. Meranda, D. Neuf, and P. Piro, "4 to 40 GHZ Even Harmonic Schottky Mixer", *IEEE MTT–S Digest*, pp. 695–698 (1988).
Technical Data Sheet (HSCH–9301 & HSCH–9351), "GaAs Beam Lead Schottky Barrier Ring and Bridge Diodes", *Arilent Technologies* (1999).
Technical Data Sheet (HMC259), "GaAs MMIC Sub–Harmonically Pumped Mixer 28–40 GHz", *Hittite Microwave Corporation*, pp. 4–112–4–117 (Feb. 2001).
Technical Data Sheet (HMC330), GaAs MMIC Sub–Harmonically Pumped Mixer 25–40 GHz, *Hittite Microwave Corporation*, pp. 4–204–4–209 (Feb. 2001).
M. Cohn, J.E. Degenford, and B.A. Newman, "Harmonic Mixing with an Anti–Parallel Diode Pair", *IEEE S–MITT International Microwave Symposium Digest*, pp. 171–172 (Jun. 1974).
M.V. Schneider and W.W. Snell, Jr., "Harmonically Pumped Stripline Down–Converter", *IEEE Transactions on Microwave Theory and Techniques*, vol. MTT–23, No. 3, pp. 271–275 (Mar. 1975).
D. Neuf, Even Harmonic Mixers Offer Unique Features for Millimeter Bands, *Microwave System News*, pp. 103–119 (1982).

* cited by examiner

*Primary Examiner*—Simon Nguyen
(74) *Attorney, Agent, or Firm*—Baker Botts LLP (57) ABSTRACT

A surface mount, even harmonic mixer is preferably used in point-to-multipoint millimeter wave transceivers. The mixer includes an anti-parallel series arrangement of diodes in one or more ring quads to increase the input 1 dB compression point and third-order input intercept point (IP3), while maintaining the benefits inherent with even harmonic mixing.

24 Claims, 13 Drawing Sheets

EVEN HARMONIC MIXER WITH HIGH-INPUT, THIRD-ORDER INTERCEPT POINT

BACKGROUND OF THE INVENTION

1. Field of the Invention

The present invention generally relates to electronic mixers and more particularly to a surface-mount, even harmonic mixer exhibiting a high-input, third-order intercept point with low parasitic inductance and capacitance.

2. Description of the Prior Art

Second harmonic mixing using two anti-parallel Schottky diodes has been investigated by Cohn (M. Cohn, J. E. Degenford, B. A. Newman, *Harmonic Mixing With An Antiparallel Diode Pair*, IEEE S-MTT Int. Microwave Symposium Digest (1974) pp. 171–172) and Schneider (M. V. Schneider and W. W. Snell, Jr., *Harmonically Pumped Stripline Down-Converter*, IEEE Trans. Microwave Theory Tech., Vol. MTT-23, No. 3, March 1975, pp. 271–275). These investigations were extended by Neuf (D. Neuf, *Even Harmonic Mixers Offer Unique Features for Millimeter Bands*, Microwave System News, April 1982, pp. 103–119) to include four pairs of anti-parallel diodes in a bridge circuit. Four pairs of diodes enable the introduction of local oscillator (LO) energy with multi-octave radio frequency (RF) isolation from 2–18 GHz. Each of these references is incorporated herein by reference.

One way to understand the operation of an even harmonic mixer is to exploit the concept of a time varying radio frequency (RF) load. In this mode, also referred to as the reflection mode, incident radio frequency (RF) energy propagates toward the diode load, which is being driven by a local oscillator (LO) signal having a much greater amplitude. The action of the LO signal causes the diode load, and therefore the reflection coefficient presented to the RF signal, to vary as a function of time. Utilizing anti-parallel diode pairs enables conduction on both the positive and negative portions of the local oscillator (LO) voltage waveform. The resulting RF reflection coefficient varies at twice the rate of the LO signal.

Single- or multiple-pair, diode harmonic mixers achieve mixing action by reflecting RF energy from periodically changing diode impedances. Alternate diodes become forward-biased during the positive and negative cycles of the LO signal, which presents an "on" reflection coefficient of −1. During a short transition period, while there is insufficient LO voltage to turn the diodes on, an "off" reflection coefficient of +1 is presented. Hence, on and off ideal RF reflection coefficients of +/−1 occur twice for each cycle of the LO signal.

A phase difference of 180° between states must be maintained across the band of each of two different ports of a diode integrated circuit device. This requirement is easily satisfied at lower frequencies, but becomes exceedingly difficult to meet as frequency increases, due to parasitic inductance associated with the leads of the package.

An additional consequence of even harmonic mixing is, because of its single balanced nature, all mixing products appear across the diode bridge, which necessitates the use of a diplexer to separate the intermediate frequency (IF) output from the radio frequency (RF) input.

The reflected signal, which is a product of the load reflection coefficient and the incident signal, contains terms at RF, LO, 2×LO, RF−2×LO and RF+2×LO frequencies, as well as higher order terms. The term at RF−2×LO is referred to as the intermediate frequency (IF) and is filtered from the incident transmission line. The LO and RF signals are mutually isolated due to balance and symmetry, but the RF and IF signals exist in the same mode.

As a result, the reflection mode mixture is inherently single-balanced. The term at 2×LO is considered local oscillator (LO) leakage in a fundamental mixer. The symmetry of the even harmonic diode structure typically suppresses the 2×LO term an additional 20 dB compared to a fundamental mixer, making post filtering significantly less complex.

Even harmonic mixers are capable of achieving as low a conversion loss as fundamental mixers, and typically require less drive power from the LO signal for an equivalent single-balanced topology. This is advantageous since it results in a significant simplification of the local oscillator (LO) drive circuitry.

However, one disadvantage of even harmonic mixers is a reduced output 1 dB compression point when compared to fundamental mixers. The reduced output results from reduced input drive-level requirements of even harmonic mixers. A high-gain, low-noise amplifier (LNA), which is used in point-to-multipoint millimeter-wave radio system receivers to achieve noise figure requirements, forces the RF input power of the mixer to a relatively high level.

As a result, the third-order intercept point (IP3) performance of the mixer is critical to achieving overall system performance. The inability of conventional even harmonic mixers to meet IP3 requirements of the system has kept this type of mixer out of many communication receivers despite its many advantages. The third-order, input-intercept point is defined by U.S. Pat. No. 6,229,395 to Kay (column 5, lines 8–12), which is incorporated herein by reference, as a virtual measurement of the signal strength at which the third-order distortion energy power of the gain stage is as strong as the fundamental signal energy. IP3 is also used as an overall measure of linearity.

Figure 1:
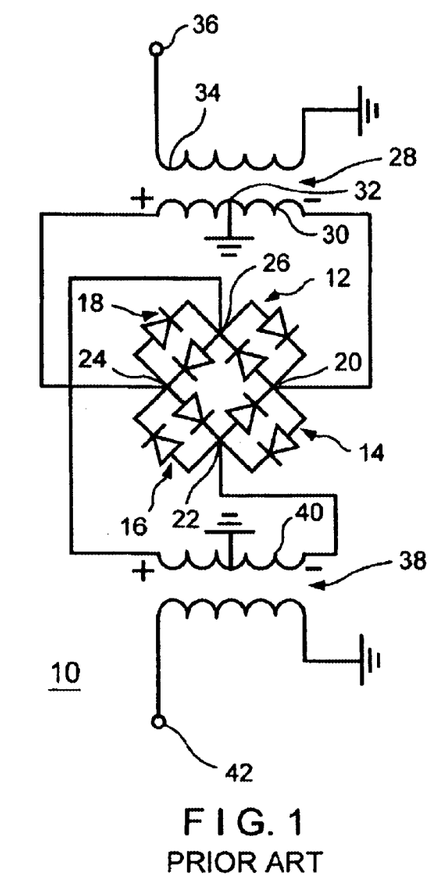
FIG. 1 is a schematic representation of a conventional, eight-diode ring mixer.

FIG. 1 shows a conventional, eight-diode ring mixer 10, which includes four anti-parallel diode-pairs 12, 14, 16, 18. The term "anti-parallel diode-pair" refers to a pair of diodes connected in parallel with opposing polarity. The mixer 10 requires two balum transformers 28, 38, but is still considered single-balanced. The addition of two transformers 28, 38 greatly adds to the complexity of the mixer 10 and limits its performance and frequency response due to parasitic inductances and capacitances.

As mentioned above, the mixer 10 includes four anti-parallel, diode-pairs 12, 14, 16, 18, each of which includes two diodes. The cathode of each diode in each anti-parallel pair of diodes is connected to the anode of the other diode in the pair resulting in a parallel connection of pairs of diodes wherein each anode is connected to a cathode and each cathode is connected to an anode. The anti-parallel diode pair 12 is connected to the anti-parallel diode pair 14 at node 20, the anti-parallel diode pair 14 is connected to the anti-parallel diode pair 16 at node 22, the anti-parallel diode pair 16 is connected to the anti-parallel diode pair 18 at node 24, and the anti-parallel diode pair 18 is connected to the anti-parallel diode pair 12 at node 26.

The first transformer 28 includes a first winding 30 connected in a series across nodes 24 and 20. A positive terminal of the first winding 30 is connected to node 24, a negative terminal of the first winding 30 is connected to node 20, and a center tap 32 of the first winding 30 is connected to ground. The first transformer 28 includes a second winding 34 connected in a series across a local oscillator (LO) input terminal 36 and ground.

The second transformer 38 includes a first winding 40, which has a positive terminal connected to node 26, a negative terminal connected to node 22, and a center tap connected to ground. The second transformer 38 also includes a second winding connected in a series across a radio frequency/intermediate frequency terminal 42 and ground. Additional details concerning the eight-diode mixer 10 are provided in J. L. Merenda, D. Neuf, and P. Piro, 4 to 40 *GHZ Even Harmonic Schottky Mixer*, IEEE MTT-S Digest (1988) pp. 695–698, which is incorporated herein by reference.

Figure 2:
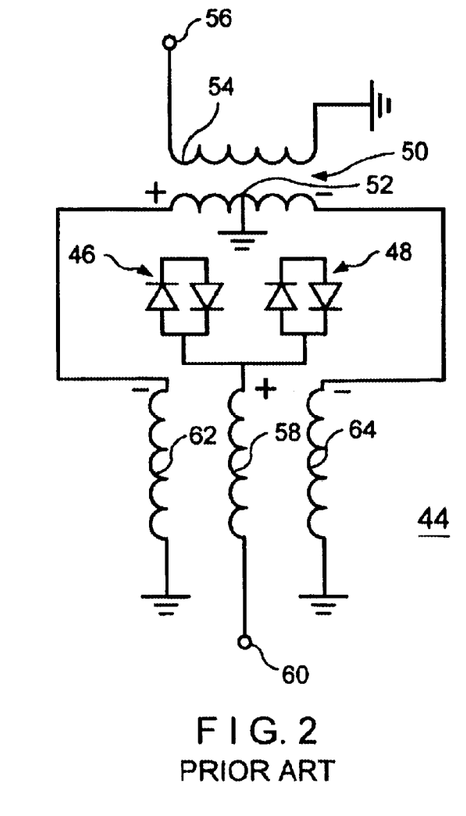
FIG. 2 is a schematic representation of a conventional dual, anti-parallel, diode-pair mixer.

A conventional dual, anti-parallel diode pair single balanced mixer 44 is shown in FIG. 2. The mixer 44 is not able to achieve the input-intercept point exhibited by the conventional eight-diode mixer 10 shown in FIG. 1. The mixer 44 includes two anti-parallel pairs of diodes 46, 48 and a first transformer 50 having a first winding 52.

A positive terminal of the first winding 52 is connected to the anti-parallel diode pair 46 and a negative terminal of the first winding 52 is connected to the anti-parallel diode pair 48. The first transformer 50 includes a second winding 54 connected in series across a local oscillator (LO) input terminal 56 and ground.

A transformer shown as coils 58, 62, 64 is intended to represent an equivalent circuit (or lumped element representation) of a coplanar waveguide. The coplanar waveguide is electrically connected in series between the anti-parallel diode pairs 46, 48 and a radio frequency/intermediate frequency terminal 60.

Further examples of conventional mixers employing anti-parallel diode pairs are provided in U.S. Pat. No. 5,416,449 to Joshi; U.S. Pat. No. 5,771,449 to Blasing, et al.; U.S. Pat. No. 5,553,319 to Tanbakuchi; U.S. Pat. No. 5,787,126 to Itoh, et al.; and U.S. Pat. No. 5,995,819 to Yamaji, et al.; each of which are incorporated herein by reference. Examples of mixers using anti-parallel diode pairs are the HMC259 and HMC330, which are commercially available from Hittite Microwave Corporation, Chelmsford, Mass. 01824.

Even harmonic mixers are often used in point-to-multipoint millimeter wave radio systems, which will now be described. A variety of multichannel RF signal distribution systems are currently employed to deliver commercial broadcast television programming to residential customers. These RF transmission systems are often called "wireless cable" television systems, because they can provide multi-channel entertainment programming identical to conventional cable television services, but without the cost and disruption incurred in installing video cable between the program provider's studio and each customer's residence.

United States electronic equipment suppliers have manufactured RF transmission systems to provide Multichannel Multi-Point Distribution Service (MMDS). These MMDS systems have been installed in major metropolitan areas and are used by the television entertainment industry to augment conventional television broadcasts by transmitting premium video programming to residential subscribers on a fee (pay-per-view) basis.

MMDS uses allocated spectrum at various frequencies in the 2.1 to 2.7 GHz band to transmit fourteen independent channels of video. The MMDS transmitters are installed at locations authorized by the United States Federal Communications Commission (FCC). Each of these transmitter locations has been selected so that it can broadcast into the surrounding service area without creating interference in the adjacent service areas.

In responding to the need for additional wireless, multi-point, television, distribution spectrum, that is, in addition to the authorized MMDS spectrum, the FCC issued an interim operating license in the 27.5 to 29.5 GHz band. The technology employed for use of this spectrum has been designated as LMDS and one implementation of an LMDS system is disclosed in U.S. Pat. No. 4,747,160 to Bossard, which is incorporated herein by reference.

Both LMDS and its predecessor MMDS broadcast multichannel television signals into specified "service areas". Service areas (also referred to as "cells") identify non-overlapping geographic regions that receive interference-free transmission from separate transmitter sites.

LMDS systems provide high-bandwidth, interactive services as the preferred wireless platform for enhancing and extending the current global broadband communications infrastructure. LMDS is distinct from other conventional copper cable, optical fiber, and low frequency wireless systems in its use of millimeter-wave frequencies for wireless distribution and cellular-like layouts for spectrum reuse and spectral efficiency.

The major advantages of millimeter wave distribution systems are the inherent broad transmission bandwidths that may be achieved and the opportunity to minimize the use and hence, the time and cost of implementing wired infrastructure. For example, 1 GHz of bandwidth centered at 28 GHz, has been allocated by the FCC for a one-way television service in the New York City metropolitan area.

A system formed in accordance with the teachings of U.S. Pat. No. 4,747,160 to Bossard, has been deployed under this allocation. The system uses essentially omni-directional cell-sites arranged in a center-excited cellular pattern to provide one-way television service to residential customers throughout the New York City metropolitan area using carriers centered around 28 GHz.

The signals transmitted by the cell-sites are received by high-gain/narrow-beam antenna/receiver units, which are normally located just inside or outside of a subscriber's window. The received signals are then down-converted and cabled to a set-top receiver and encryption unit that processes and conveys the video and audio signals to conventional, analog televisions systems.

Each cell has a channel assignment and polarization allocation that provides for the mitigation of co-channel and adjacent-channel interference making possible frequency reuse, and therefore improved spectral efficiency within a given coverage area. The center-excited coverage plan by the system disclosed in the Bossard reference is based upon geographically partitioned subscribers/receivers within given cells and assumes that each receiver assigned to a cell is serviced specifically by the one cell-site transmitter and omni-directional antenna that is geographically associated with the given cell in which the subscriber is located.

LMDS systems include a microcellular configuration including a large number of cells wherein each cell ranges from about 0.5 km$^2$ to 2 km$^2$ in size. The cells contain a base station serving many subscriber units and a large number of subscriber units are required to support an LMDS system. The subscriber units are sold to consumers and must be simply and inexpensively manufactured while maintaining an acceptable level of performance.

Figure 3:
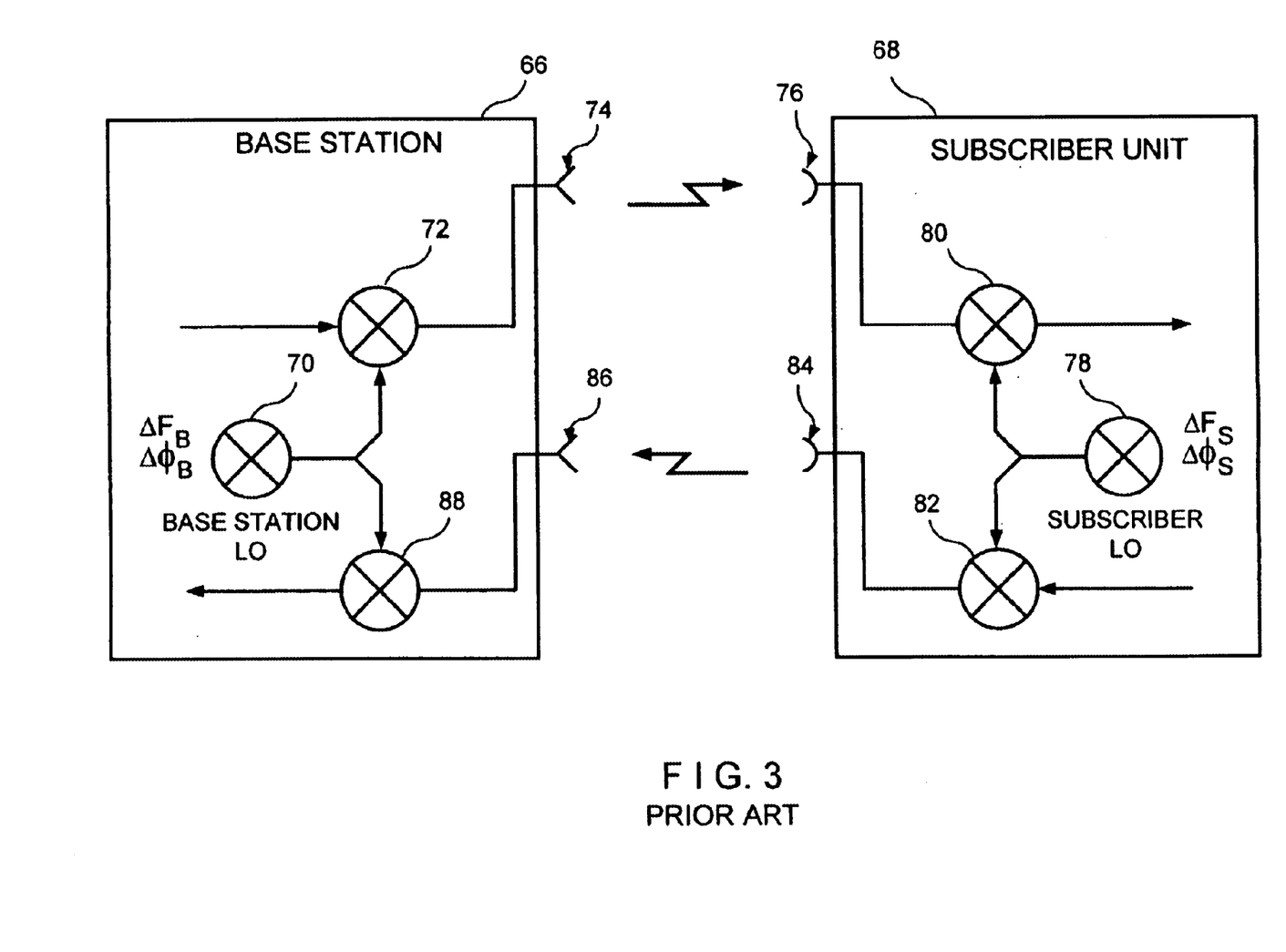
FIG. 3 is a block diagram of a conventional Local Multi-Point Distribution Service (LMDS) system.

FIG. 3 shows a base station transceiver 66 and a subscriber unit transceiver 68. Generally, the base station 66 includes a base local oscillator 70, which provides a base local oscillator signal to a first input of a first base mixer 72. A modulated transmit signal is coupled to a second input of the first base mixer 72. The first base mixer 72 mixes the modulated transmit signal with the base local oscillator signal and frequency upconverts the modulated transmit signal.

The frequency-upconverted, modulated signal is transmitted to subscriber units through a first base antenna 74. The subscriber unit 68 receives the modulated signal from the base station 66 through a first subscriber antenna 76. The subscriber unit 68 also includes a subscriber local oscillator 78, which is coupled to a first subscriber mixer 80 for frequency downconverting the received modulated signal. The frequency downconverted modulated signal can then be demodulated.

Modulated signals are also transmitted from the subscriber unit 68 to the base station 66. The subscriber unit local oscillator 78 is coupled to a second subscriber mixer 82, which frequency upconverts a subscriber-modulated signal for transmission to the base station 66 through a second subscriber antenna 84.

The base station 66 receives the subscriber-modulated signal from the subscriber unit 68 through a second base antenna 86. The base local oscillator 70 is also coupled to a second base mixer 88, which frequency downconverts the received subscriber modulated signal. The frequency downconverted modulated signal can then be demodulated.

The subscriber unit 68 receives a high frequency (27.5–28.35 GHZ) digitally-modulated signal from the base station 66. The subscriber unit 68 frequency downconverts the received, high-frequency signal to an intermediate frequency (950–1800 MHZ) that a subscriber modem is able to demodulate.

The subscriber unit 68 also receives a low frequency (400–700 MHZ) digitally-modulated signal from the subscriber modem. The subscriber unit 68 frequency upconverts the low-frequency, modulated signal to a transmission frequency (31–31.3 GHZ).

Therefore, the availability for use in LMDS systems of an even harmonic mixer capable of achieving as low a conversion loss as fundamental mixers and also achieving as high an input intercept point as a fundamental mixer referenced to the same LO drive power level would be advantageous.

OBJECTS AND SUMMARY OF THE INVENTION

It is an object of the present invention to provide a high performance method and apparatus with low complexity for even harmonic mixing having an acceptable frequency response.

It is another object of the present invention to provide a method and apparatus for even harmonic mixing that is suitable for use in point-to-multipoint millimeter wave radio applications.

It is yet another object of the present invention to provide a method and apparatus for even harmonic mixing that does not require anti-parallel diode pairs.

It is a further object of the present invention to provide a method and apparatus for even harmonic mixing that uses diodes configured in one or more ring quads or anti-parallel series-pairs.

It is still a further object of the present invention to provide a method and apparatus for even harmonic mixing that exhibits acceptable linearity and a high-input, third-order intercept point (IP3).

It is yet a further object of the present invention to provide a method and apparatus for even harmonic mixing that exhibits low parasitic capacitance and inductance.

It is still another object of the present invention to provide a method and apparatus for even harmonic mixing that does not require dual balun transformers.

It is yet another object of the present invention to provide a method and apparatus for surface mounting even harmonic mixers that use diodes configured in beam-lead packages.

An even harmonic mixer formed in accordance with one form of the present invention, which incorporates some of the preferred features, includes a local oscillator input terminal, a slotline balun transformer, two anti-parallel, series-pair configurations of diodes, and a radio frequency/intermediate frequency terminal. The local oscillator input terminal inputs a local oscillator signal and the two anti-parallel, series-pair configurations of diodes are responsive to this signal.

The slotline balun transformer is electrically connected between the local oscillator input terminal and the two anti-parallel, series-pair configurations of diodes and the two anti-parallel, series-pair configurations of diodes output a radio frequency signal. Each of the two anti-parallel, series-pair configurations of diodes includes a plurality of diodes. The diodes are electrically connected together in series such that the anode of each of the diodes is coupled to the cathode of at least one other of the diodes and the cathode of each of the diodes is coupled to the anode of at least one other of the diodes.

The radio frequency/intermediate frequency terminal is responsive to the radio frequency signal output by the two anti-parallel, series-pair configurations of diodes and inputs an intermediate frequency signal. The two anti-parallel, series-pair configurations of diodes are responsive to the intermediate frequency signal input by the radio frequency/intermediate frequency terminal. The even harmonic mixer may include four anti-parallel, series-pair configurations of diodes electrically connected in a series ring configuration.

A method of even harmonic mixing in accordance with another form of the present invention, which incorporates some of the preferred features, includes the steps of inputting a local oscillator signal and coupling at least one anti-parallel, series-pair configuration of diodes to the input local oscillator signal. The method also includes inputting an intermediate frequency signal to the at least one anti-parallel, series-pair configuration of diodes and outputting a radio frequency signal from the at least one anti-parallel, series-pair configuration of diodes.

These and other objects, features, and advantages of this invention will become apparent from the following detailed description of illustrative embodiments thereof, which is to be read in connection with the accompanying drawing.

BRIEF DESCRIPTION OF THE DRAWING

FIGS. 4b, 4c, and 4d are schematic representations of anti-parallel, series-pair diode configurations for use in various embodiments of the even harmonic mixer shown in FIG. 4a.

FIG. 5 is a schematic representation of an anti-parallel, series diode pair for use in the even harmonic mixer shown in FIG. 4a;

FIG. 6a is a top view, FIG. 6b is a side view, and FIG. 6c is a schematic representation of a diode, ring quad, integrated circuit device for use in the even harmonic mixer shown in FIG. 4a;

FIG. 8 is a modeled graphical representation of conversion loss and radio frequency (RF) port return loss versus frequency for the even harmonic mixer shown in FIG. 4a;

FIG. 9 is a measured graphical representation of conversion loss and radio frequency (RF) port return loss versus frequency for the even harmonic mixer shown in FIG. 4a;

FIG. 10 is a measured graphical representation of the local oscillator (LO) port match for the even harmonic mixer shown in FIG. 4a;

FIG. 11a is a measured graphical representation of conversion gain versus radio frequency (RF) input power for the even harmonic mixer shown in FIG. 4a;

FIG. 11b is a block diagram of the test setup used to obtain the graphical result shown in FIG. 11a;

FIG. 12a is a measured graphical representation of the input, two-tone intermodulation (IM) distortion, which is measured at the output and referenced to an input of −6 dBm for the even harmonic mixer shown in FIG. 4a;

FIG. 13a shows a top view and FIG. 13b shows a side view of a surface mount, integrated circuit embodiment of the even harmonic mixer shown in FIG. 4a.

DETAILED DESCRIPTION OF THE PREFERRED EMBODIMENTS

The present invention is directed to a mixer, which is preferably for use in millimeter wave radio transceivers operating across a radio frequency (RF) band of about 26.5 to 28.5 GHz and driven by a 13.2 GHz local oscillator (LO) at about 14 dBm. The harmonic mixer formed in accordance with the present invention uses an anti-parallel, series-diode arrangement to increase the input 1 dB compression and third order intercept points, while maintaining the benefits inherent with even harmonic mixing.

Figure 4A:
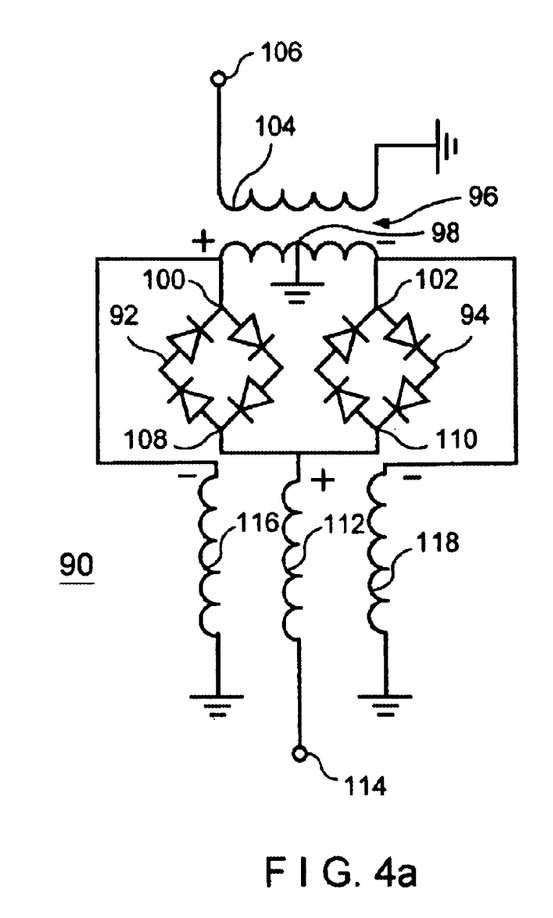
FIG. 4a is a schematic representation of an embodiment of the even harmonic mixer formed in accordance with the present invention.

The even harmonic mixer preferably utilizes a coplanar waveguide to slotline balun the local oscillator (LO) signal, and an unbalanced coplanar waveguide for the radio frequency (RF) input signal. The intermediate frequency (IF) signal is preferably extracted using a distributed microstrip diplexer. Unlike conventional even harmonic mixers, the subject mixer preferably utilizes two ring quad diode arrangements, as shown in FIG. 4a. Conventional even harmonic mixer designs have heretofore utilized various arrangements of anti-parallel diode pairs shown in FIGS. 1 and 2.

The even harmonic mixer 90 shown in FIG. 4a includes an anti-parallel arrangement of diodes in dual ring quads to increase the input 1 dB compression point and third-order intercept point, while maintaining the benefits inherent with even harmonic mixing. The mixer 90 preferably includes two diode ring quads 92, 94. Each of the ring quads preferably includes four diodes connected in series wherein the anode of each diode is connected to the cathode of a subsequent diode.

The mixer 90 preferably also includes a transformer 96 having a first winding 98. The first winding 98 has a positive terminal, which is preferably connected to the anode of one diode and a cathode of another diode in the ring quad 92 at node 100. A negative terminal of the first winding 98 is preferably connected to the anode of one diode and the cathode of another diode in the ring quad 94 at node 102.

The transformer 96 includes a second winding 104, which is preferably connected in a series across a local oscillator (LO) input terminal 106 and ground. The diode ring quad 92 includes nodes 100, 108, and the diode ring quad 94 includes nodes 102, 110. A transformer shown as coils 112, 116, 118 represents an equivalent circuit (or lumped-element representation) for a coplanar waveguide. The coplanar waveguide is preferably connected in series between the diode ring quads 92, 94 and a radio frequency/intermediate frequency terminal 114 or ground.

Figure 5:
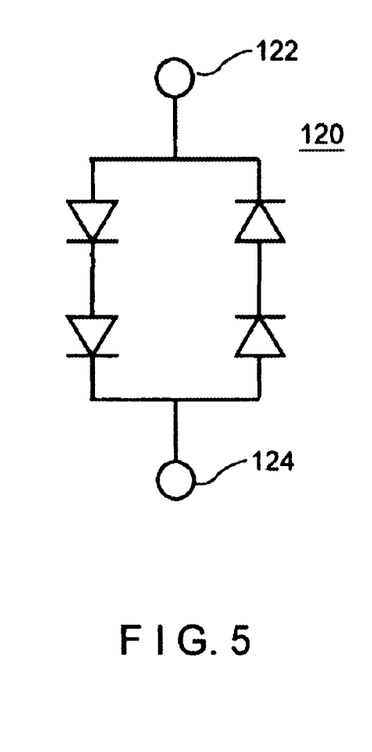

To better understand the operation of the even harmonic mixer formed in accordance with the present invention, it is beneficial to define a novel diode structure, which is not currently utilized in the realization of even harmonic mixtures. This structure will be referred to as an anti-parallel, series-pair diode configuration 120, which is shown in FIG. 5. The anti-parallel, series-pair may be realized by connecting to a ring quad at two nodes, such as nodes 122, 124 shown in FIG. 5, or nodes 100 and 108 or 102 and 110 shown in FIG. 4a.

Figure 4B:
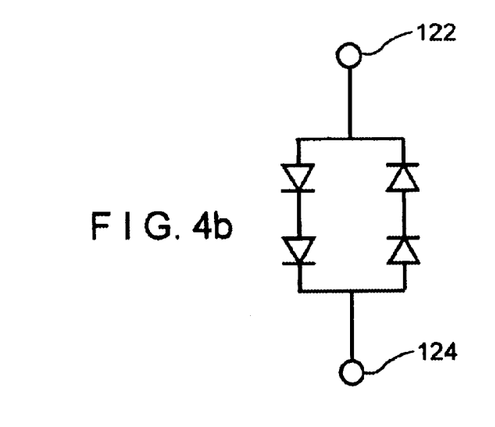
Figure 4C:
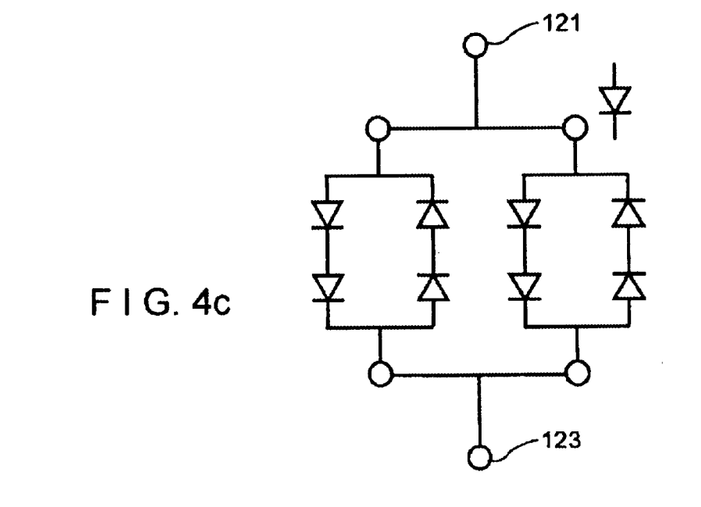
Figure 4D:
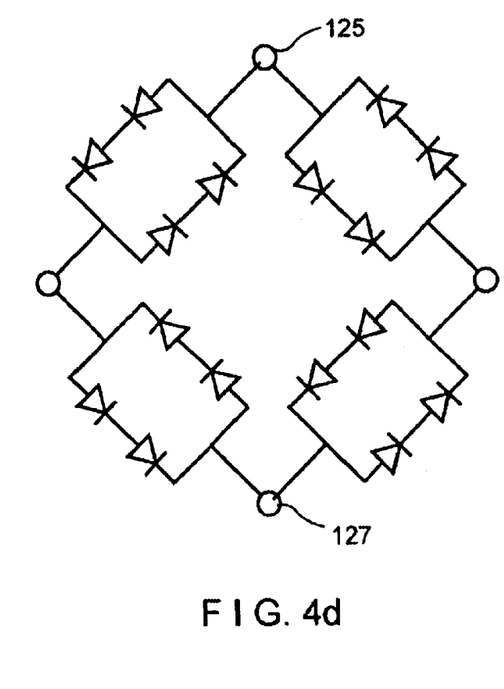

Various configurations of anti-parallel, series-pair diodes 120, as shown in FIGS. 4b, 4c, and 4d may be used to construct embodiments of the even harmonic mixer while remaining within the scope of the present invention. FIG. 4b shows a single, anti-parallel, series-pair configuration, which includes four diodes connected in series with the LO signal preferably applied to node 122 and the intermediate frequency (IF) and radio frequency (RF) signals preferably available at node 124.

FIG. 4c shows a dual, anti-parallel, series-pair diode configuration, which includes the parallel connection of two anti-parallel series pairs, as shown in FIG. 4b, with the LO signal preferably applied to node 121 and the IF and RF signals preferably available at node 123. FIG. 4d shows a ring or quad anti-parallel series-pair configuration of diodes for use in the even harmonic mixer formed in accordance with the present invention. The ring configuration includes the series connection of four anti-parallel series pairs, as shown in FIG. 4b, with the LO signal preferably applied to node 125 and the IF and RF signals preferably available at node 127.

Figures 6A, 6C:
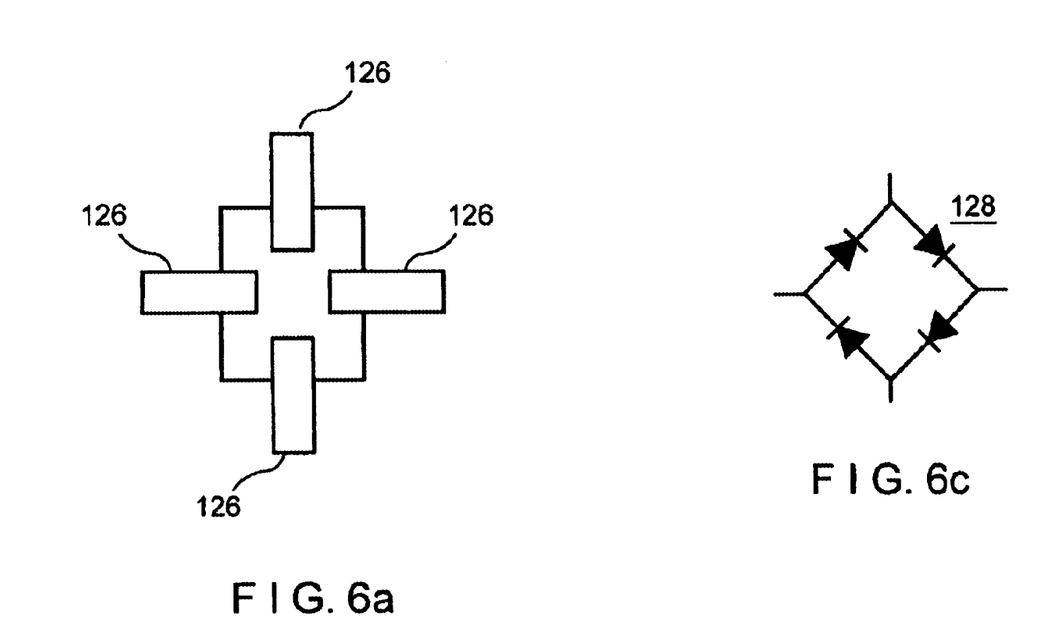
Figure 6B:
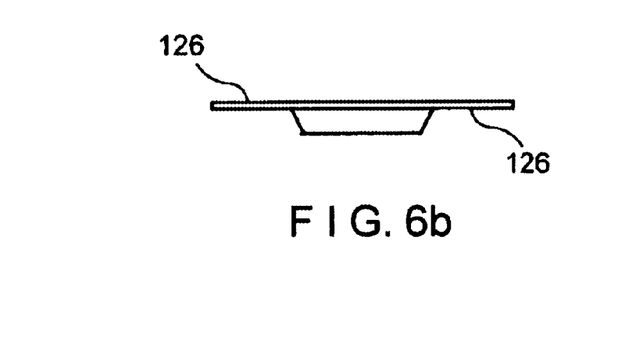

The ability to use diodes configured in a ring quad enables the use of diodes available in beam-lead, surface-mount configurations, which exhibit very small parasitic capacitances and inductances. These characteristics make such components ideal for use in high frequency mixer applications. In addition, in even harmonic mixer applications, the functionality of diode ring quads is substantially equivalent to the anti-parallel, series-pair diode configurations discussed above An example of a surface mount, beam-lead diode ring quad is the HSCH-9301 commercially available from Agilent Technologies, Palo Alto, Calif. 95054. FIG. 6a shows a top view of the HSCH-9301 and FIG. 6b shows a side view of the device. The HSCH-9301 includes four beam leads 126, two of which are preferably used for electrical connections in the mixer 90 shown in FIG. 4a either as nodes 100 and 102 or 108 and 110. As can be seen from FIG. 6c, which is a schematic representation of the HSCH-9301, the ring quad 128 can readily be adapted for use in the mixer 90 by preferably leaving two of the four beam leads 126 unconnected.

When the mixer formed in accordance with the present invention is utilized in a millimeter wave radio transceiver, significant cost savings, which result from simplification of the synthesizer and post-filtering assemblies, are achieved since even harmonic mixers operate at one-half the local oscillator frequency of conventional fundamental mixers. Preferably, a transceiver utilizing the even harmonic mixer of the present invention has a local oscillator frequency of about 13.2 GHz as opposed to about 26.4 GHz for conventional fundamental mixers. In addition, the use of anti-parallel, series-pair diode configurations result in no discernable performance degradation when compared to fundamental mixer designs.

Figure 7:
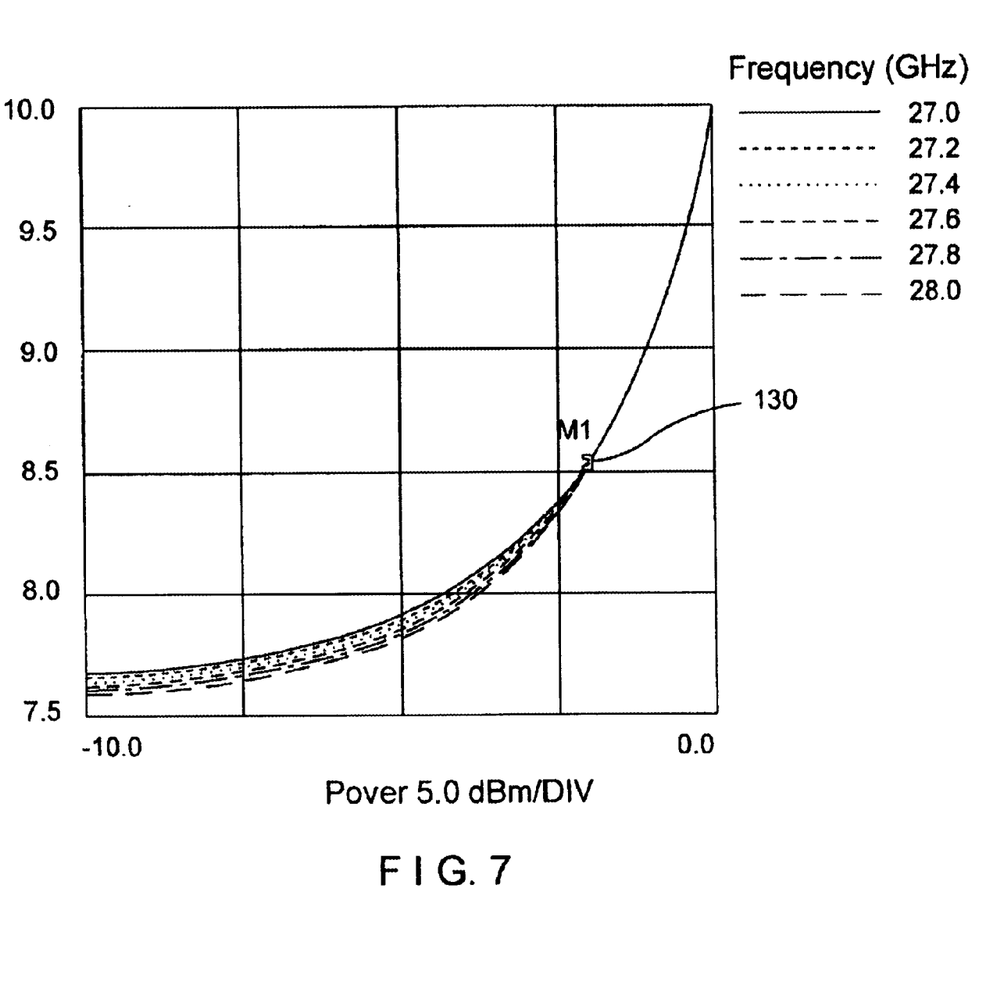
FIG. 7 is a modeled graphical representation of input power at a 1 dB conversion loss compression power for the even harmonic mixer shown in FIG. 4a, which shows a power sweep from −10 dB to +10 dB on the x-axis, input power on the y-axis, and using frequency as a parameter represented by line characteristics.
Figure 8:
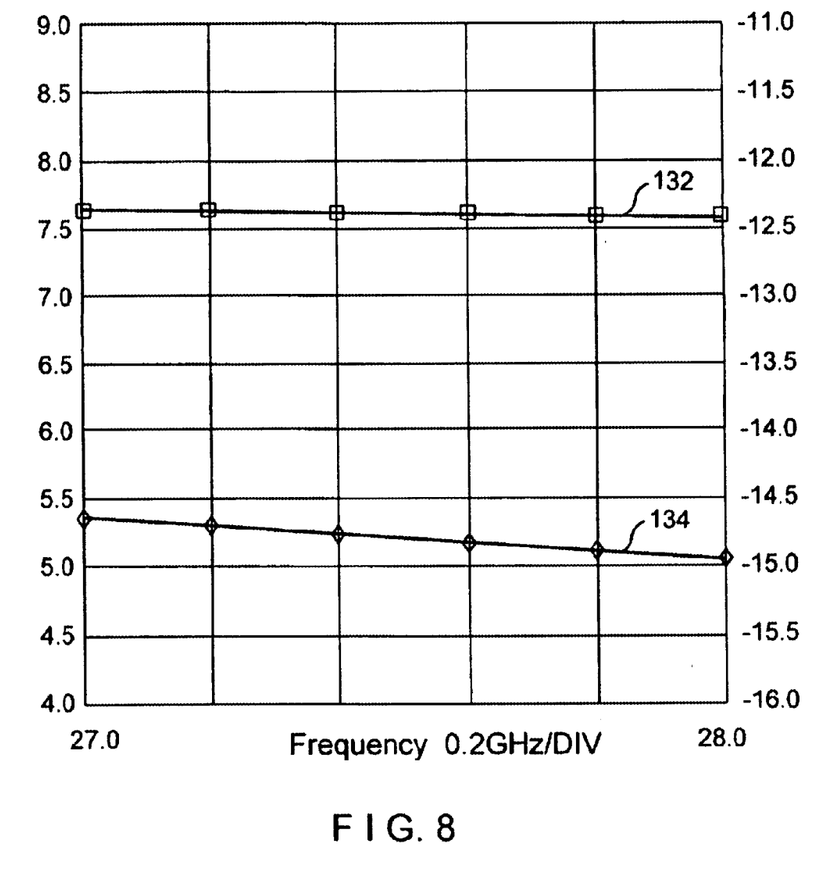

FIGS. 7 and 8 summarize the modeled results of the performance of the even harmonic mixer of the present invention obtained from computer modeling software (HP/EESOF Series IV in the full time domain analysis mode). Results of the simulation indicate about a 7.5 dB conversion loss at about a +15 dBm local oscillator level. The input 1 dB compression point is about +6 dBm.

FIG. 7 shows a graphical representation of simulation results of input power at point 130 for a 1 dB conversion loss compression power for the even harmonic mixer shown in FIG. 4a, which shows a power sweep from −10 dB to +10 dB on the x-axis, input power on the y-axis, and frequency as a parameter represented by line characteristics. FIG. 8 shows a graphical representation of conversion loss at line 132 and radio frequency (RF) port return loss at line 134 versus frequency for the even harmonic mixer shown in FIG. 4a.

Figure 9:
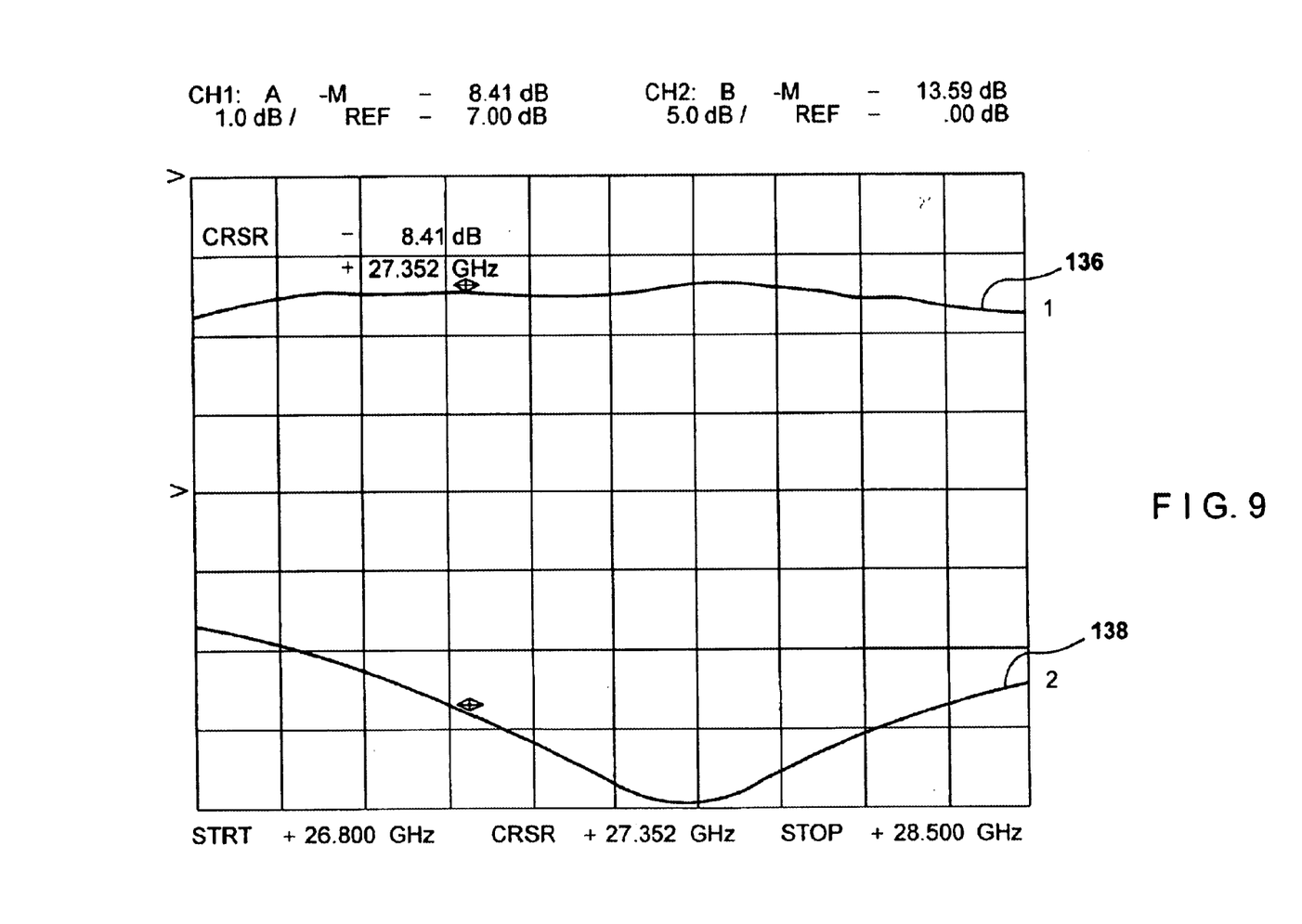
Figure 10:
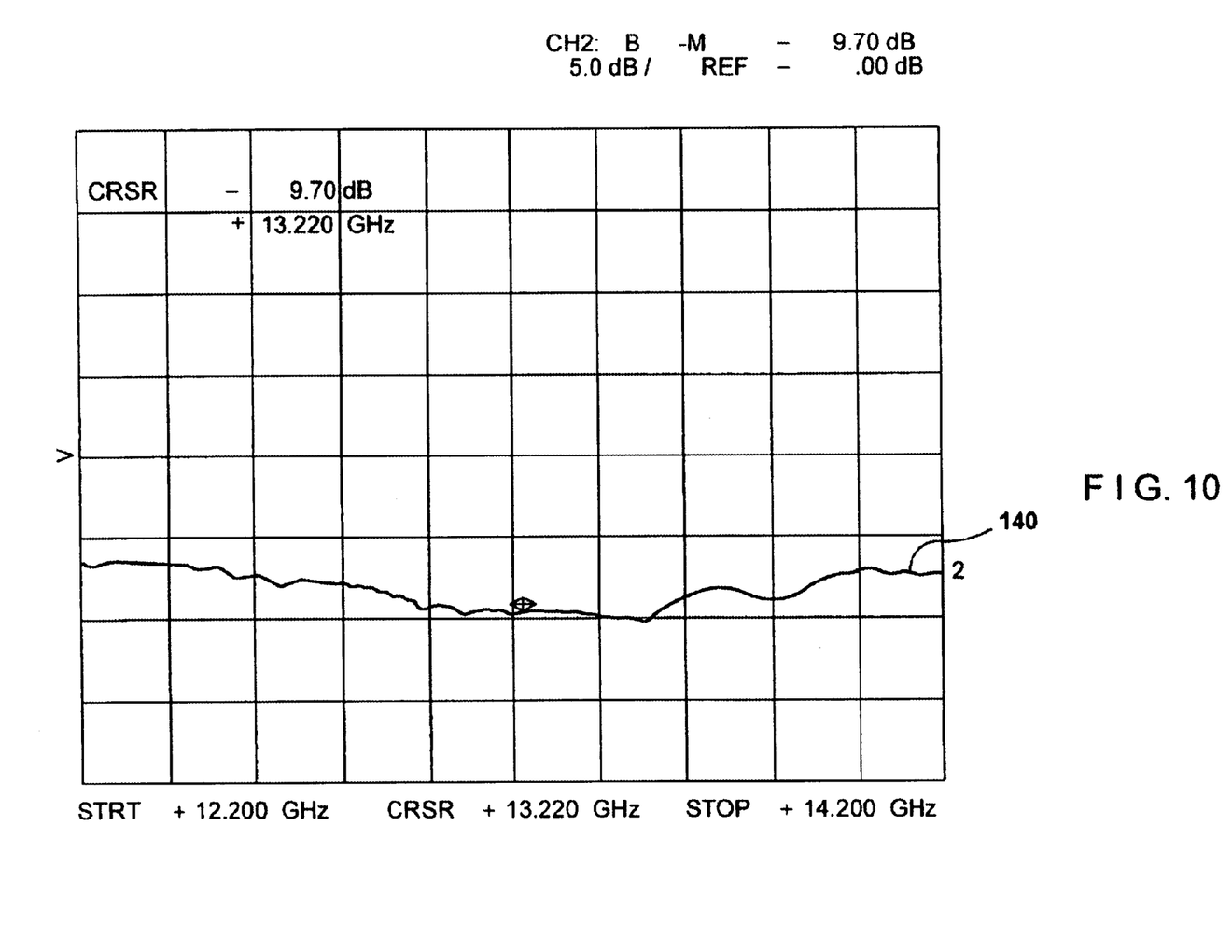

Measured results have confirmed the theoretical analysis model. FIG. 9 shows a measured graphical representation of conversion loss at line 136 and the radio frequency (RF) port return loss at line 138 versus frequency for the even harmonic mixer shown in FIG. 4a. FIG. 10 is a measured graphical representation of the local oscillator (LO) port match at line 140 for the even harmonic mixer shown in FIG. 4a.

Figure 11A:
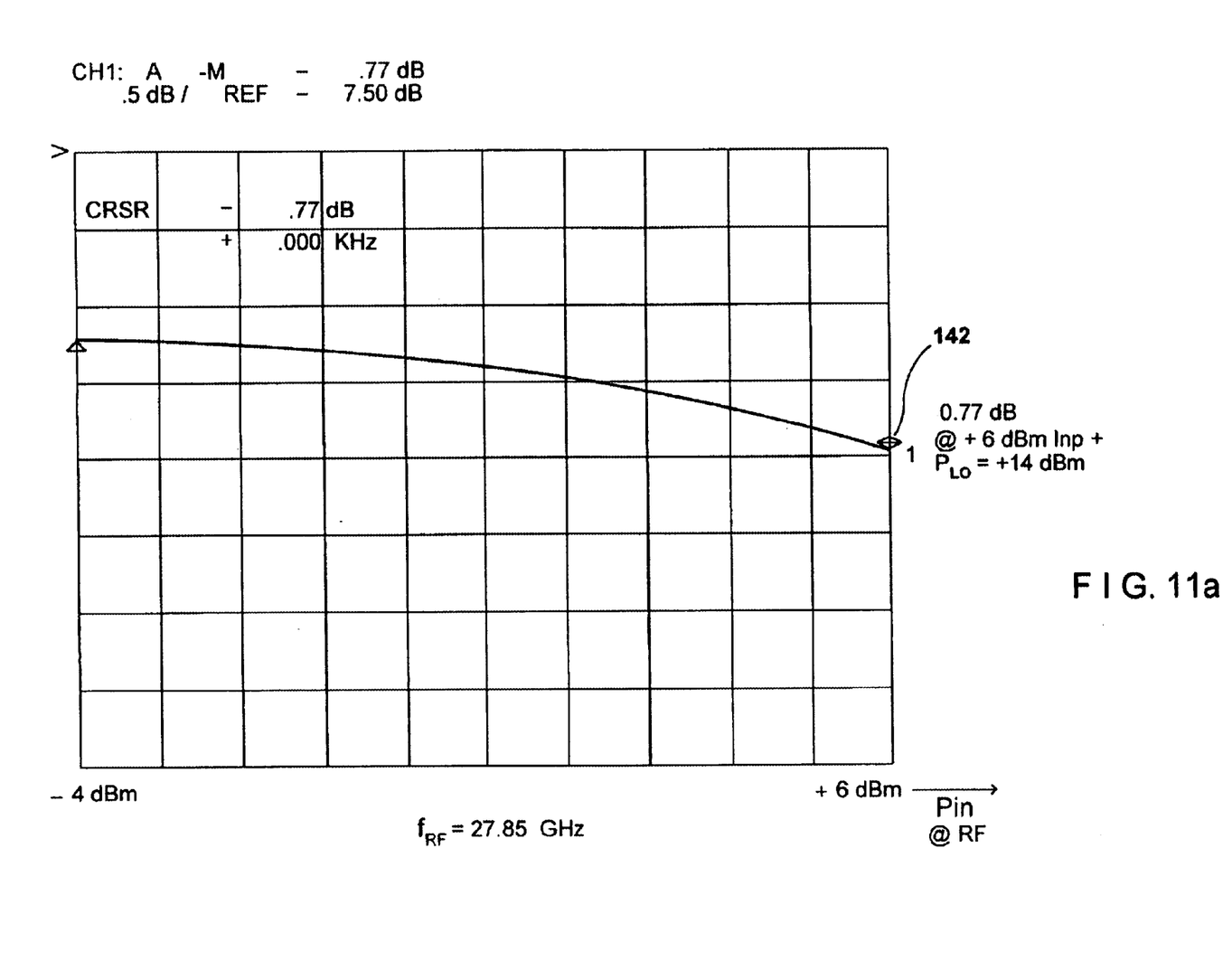
Figure 11B:
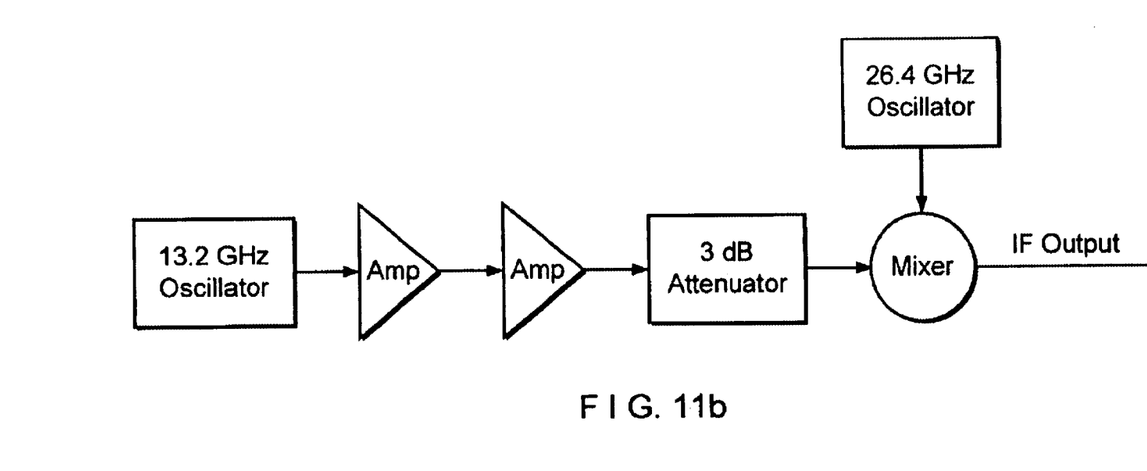

FIG. 11a is a measured graphical representation of conversion gain versus radio frequency (RF) input power for the even harmonic mixer shown in FIG. 4a, which yields 0.77 dB at point 142 for an input power of 6 dBm and a local oscillator power of 14 dBm. FIG. 11b is a block diagram of the test setup used to obtain the graphical results shown in FIG. 11a.

Figure 12A:
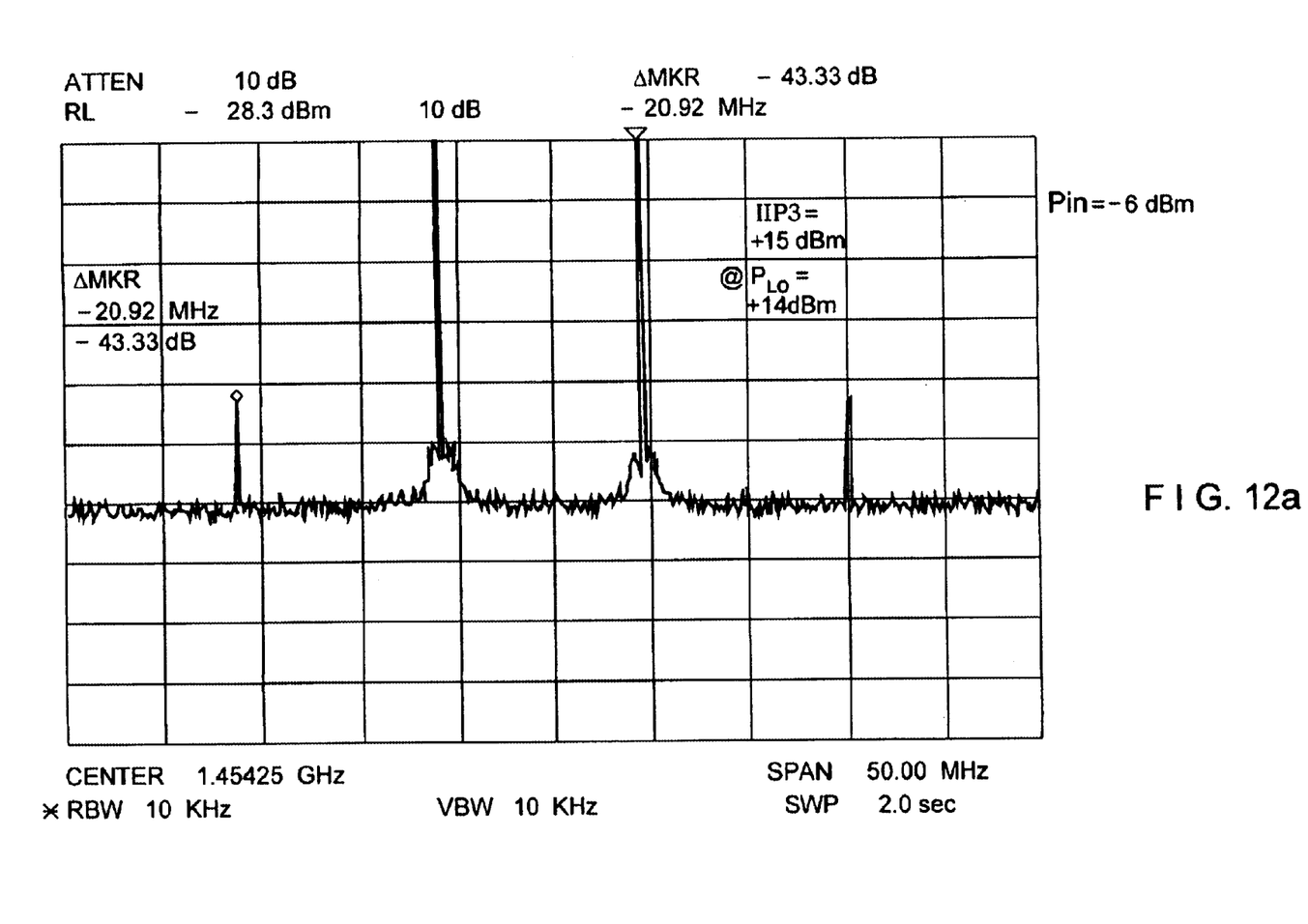
Figure 12B:
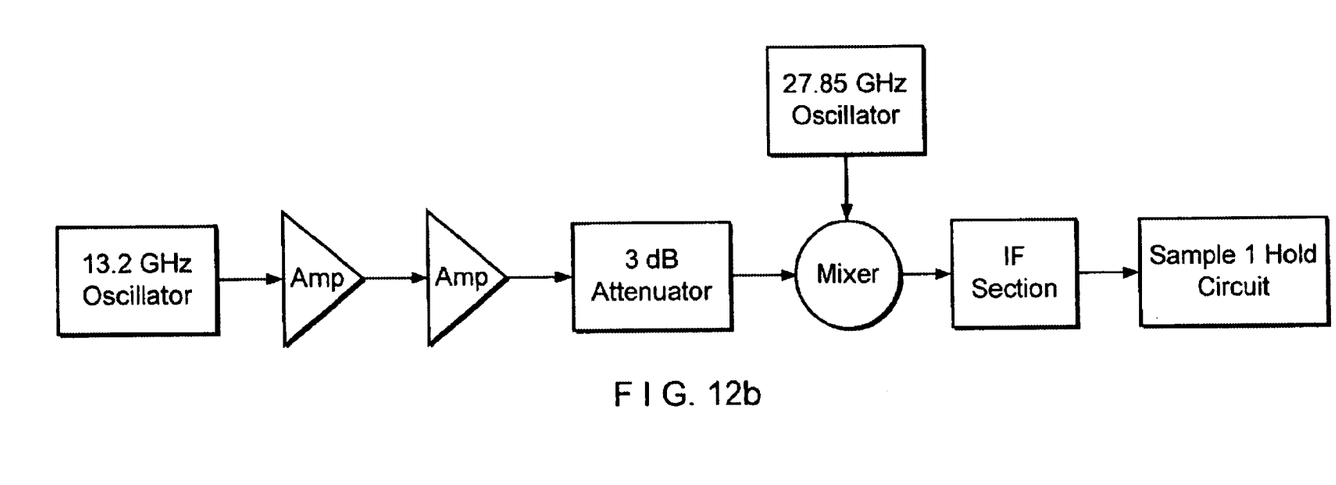
FIG. 12b is a block diagram of the test setup used to obtain the graphical result shown in FIG. 12b.

FIG. 12a is a measured graphical representation of the input, two-tone intermodulation (IM) distortion, which is measured at the output and referenced to the input of the even harmonic mixer shown in FIG. 4a. The input, third-order intercept point (IP3) is about 15 dBm for a local oscillator power of about 14 dBm and two input tones of about −6 dBm each. FIG. 12b is a block diagram of the test setup used to obtain the graphical results shown in FIG. 12b.

Figure 13A:
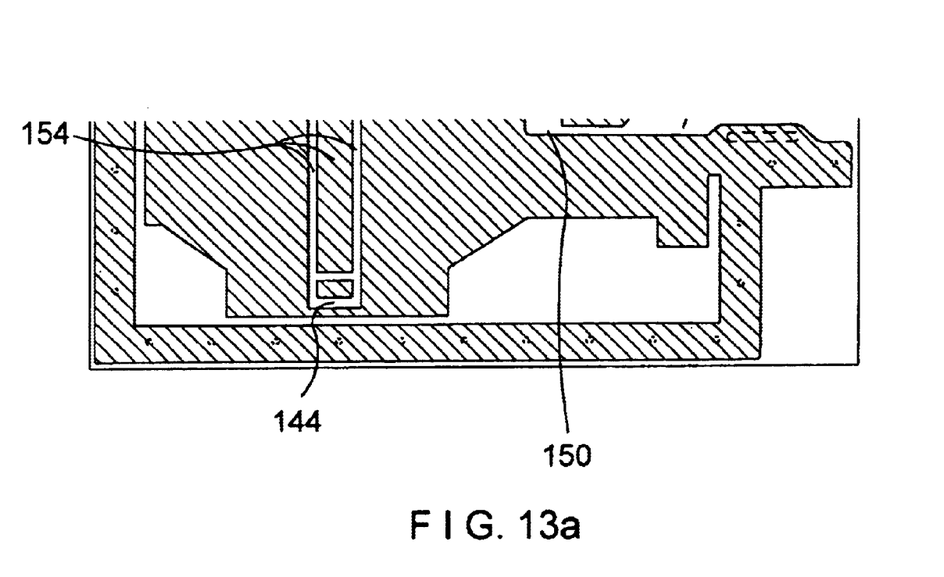
Figure 13B:
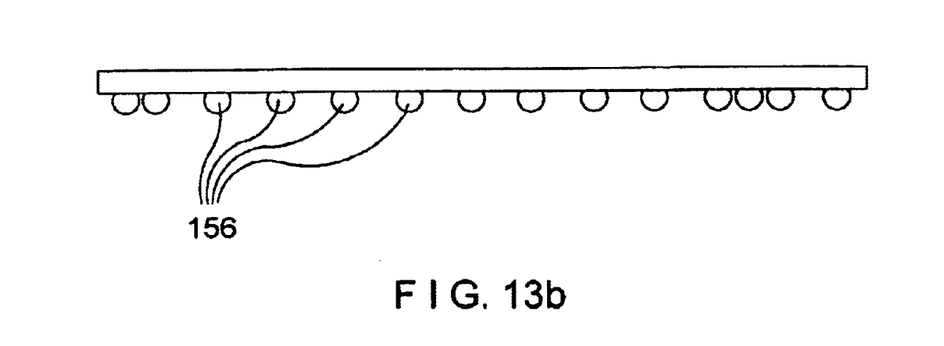

FIG. 13a shows a top view and FIG. 13b shows a side view of a surface mount, integrated circuit embodiment of the even harmonic mixer shown in FIG. 4a. A local oscillator input terminal 144 corresponds to the local oscillator input terminal 106 shown in FIG. 4a; a radio frequency/intermediate frequency terminal 146 corresponds to the radio frequency/intermediate frequency terminal 114 shown in FIG. 4a; and diode configurations 148, 150 correspond to ring quads 92, 94, respectively. A coplanar waveguide 152 is represented by inductors 112, 116, 118 in FIG. 4a; a slotline balun 154 is represented by the transformer 96 in FIG. 4a; and surface mount, ball leads 156 shown, which are shown in FIG. 13b, are used around the perimeter of the underside of the integrated circuit.

Therefore, one skilled in the art can readily see how the present invention provides a high performance method and apparatus with low complexity for even harmonic mixing having a superior frequency response that is suitable for use in millimeter wave radio applications. In addition, the present invention provides a method and apparatus for even harmonic mixing that does not require anti-parallel diode pairs and that can utilize diodes configured in one or more ring quads.

Further, the present invention provides a method and apparatus for even harmonic mixing that exhibits superior linearity and a high-input, third-order intercept point (IP3) with low parasitic capacitance and inductance. In addition, the method and apparatus for even harmonic mixing does not require dual balun transformers and may be used with surface mount technology having beam-lead packages that exhibit very low parasitics.

Although illustrative embodiments of the present invention have been described herein with reference to the accompanying drawing, it is to be understood that the invention is not limited to those precise embodiments, and that various other changes and modifications may be effected therein by one skilled in the art without departing from the scope or spirit of the invention.

What is claimed is:

1. An even harmonic mixer, which comprises:

a local oscillator input terminal, the local oscillator input terminal inputting a local oscillator signal;

at least one anti-parallel, series-pair configuration of diodes, the at least one anti-parallel, series-pair configuration of diodes being responsive to the local oscillator signal, the at least one anti-parallel, series-pair configuration of diodes outputting an intermediate frequency signal; and a radio frequency/intermediate frequency terminal, the radio frequency/intermediate frequency terminal being responsive to the intermediate frequency signal output by the at least one anti-parallel, series-pair configuration of diodes, the radio frequency/intermediate frequency terminal inputting a radio frequency signal, the at least one anti-parallel, series-pair configuration of diodes being responsive to the radio frequency signal input by the radio frequency/intermediate frequency terminal.

2. An even harmonic mixer as defined by claim 1, further comprising at least one transformer, the at least one transformer being electrically connected between the local oscillator input terminal and the at least one anti-parallel, series-pair configuration of diodes.

3. An even harmonic mixer as defined by claim 2, wherein the transformer includes a slotline balun transformer.

4. An even harmonic mixer as defined by claim 2, wherein the anode of one of the plurality of diodes of the at least one anti-parallel, series-pair configuration of diodes and the cathode of at least one other of the plurality of diodes of the at least one anti-parallel, series-pair configuration of diodes are coupled to the at least one transformer.

5. An even harmonic mixer as defined by claim 1, further comprising at least one coplanar waveguide, the at least one coplanar waveguide being electrically connected between the at least one anti-parallel, series-pair configuration of diodes and the radio frequency/intermediate frequency terminal.

6. An even harmonic mixer as defined by claim 1, wherein the at least one anti-parallel, series-pair configuration of diodes includes a plurality of diodes, the plurality of diodes being electrically connected together in series, each of the plurality of diodes including an anode and a cathode, the anode of each of the plurality of diodes being coupled to the cathode of at least one other of the plurality of diodes, the cathode of each of the plurality of diodes being coupled to the anode of at least one other of the plurality of diodes.

7. An even harmonic mixer as defined by claim 1, wherein the at least one anti-parallel, series-pair configuration of diodes includes four diodes.

8. An even harmonic mixer as defined by claim 1, wherein the radio frequency/intermediate frequency terminal is coupled to the anode of one of the plurality of diodes of the at least one anti-parallel, series-pair configuration of diodes and the cathode of at least one other of the plurality of diodes of the at least one anti-parallel, series-pair configuration of diodes.

9. An even harmonic mixer as defined by claim 1, wherein the even harmonic mixer includes two anti-parallel, series-pair configurations of diodes, the two anti-parallel, series-pair configurations of diodes being electrically connected in parallel.

10. An even harmonic mixer as defined by claim 1, wherein the even harmonic mixer includes four anti-parallel, series-pair configurations of diodes, the four anti-parallel, series-pair configurations of diodes being electrically connected in a series ring configuration.

11. A method of even harmonic mixing, which comprises the steps of:
inputting a local oscillator signal;
coupling at least one anti-parallel, series-pair configuration of diodes to the input local oscillator signal;
inputting a radio frequency signal to the at least one anti-parallel, series-pair configuration of diodes; and
outputting an intermediate radio frequency signal from the at least one anti-parallel, series-pair configuration of diodes.

12. A method of even harmonic mixing as defined by claim 11, further comprising the step of transforming the local oscillator signal electrically.

13. A method of even harmonic mixing as defined by claim 12, wherein the local oscillator signal is electrically transformed with a slotline balun transformer.

14. A method of even harmonic mixing as defined by claim 11, further comprising the step of coupling at least one coplanar waveguide to the at least one anti-parallel, series-pair configuration of diodes.

15. A method of even harmonic mixing as defined by claim 14, wherein the step of outputting a radio frequency signal from the at least one anti-parallel, series-pair configuration of diodes further comprises the step of outputting the radio frequency signal from the anode of one of the plurality of diodes of the at least one anti-parallel, series-pair configuration of diodes and the cathode of at least one other of the plurality of diodes of the at least one anti-parallel, series-pair configuration of diodes.

16. A method of even harmonic mixing as defined by claim 11, wherein the step of coupling the at least one anti-parallel, series-pair configuration of diodes to the local oscillator signal further comprises the step of coupling a plurality of diodes electrically together in series, each of the plurality of diodes including an anode and a cathode, the anode of each of the plurality of diodes being coupled to the cathode of at least one other of the plurality of diodes, the cathode of each of the plurality of diodes being coupled to the anode of at least one other of the plurality of diodes.

17. A method of even harmonic mixing as defined by claim 11, wherein the step of coupling the at least one anti-parallel, series-pair configuration of diodes to the local oscillator signal further comprises the step of coupling the anode of one of the plurality of diodes of the at least one anti-parallel, series-pair configuration of diodes and the cathode of another one of the plurality of diodes of the at least one anti-parallel, series-pair configuration of diodes to the local oscillator signal.

18. A method of even harmonic mixing as defined by claim 11, further comprising the step of coupling two anti-parallel, series-pair configurations of diodes electrically in parallel.

19. A method of even harmonic mixing as defined by claim 11, further comprising the step of coupling four anti-parallel, series-pair configurations of diodes electrically in a series configuration.

20. An even harmonic mixer, which comprises:
a local oscillator input terminal, the local oscillator input terminal inputting a local oscillator signal;
a slotline balun transformer, the slotline balun transformer being responsive to the local oscillator signal;
two anti-parallel, series-pair configurations of diodes, the two anti-parallel, series-pair configurations of diodes being responsive to the local oscillator signal, the slotline balun transformer being electrically connected between the local oscillator input terminal and the two anti-parallel, series-pair configurations of diodes, the two anti-parallel, series-pair configurations of diodes outputting an intermediate frequency signal, each of the two anti-parallel, series-pair configurations of diodes including a plurality of diodes, the plurality of diodes being electrically connected together in series, each of the plurality of diodes including an anode and a cathode, the anode of each of the plurality of diodes being coupled to the cathode of at least one other of the plurality of diodes, the cathode of each of the plurality of diodes being coupled to the anode of at least one other of the plurality of diodes; and
a radio frequency/intermediate frequency terminal, the radio frequency/intermediate frequency terminal being responsive to the intermediate frequency signal output by the two anti-parallel, series-pair configurations of diodes, the radio frequency/intermediate frequency terminal inputting a radio frequency signal, the two anti-parallel, series-pair configurations of diodes being responsive to the radio frequency signal input by the radio frequency/intermediate frequency terminal.

21. An even harmonic mixer as defined by claim 20, further comprising at least one coplanar waveguide, the at least one coplanar waveguide being electrically connected between the two anti-parallel, series-pair configuration of diodes and the radio frequency/intermediate frequency terminal.

22. An even harmonic mixer as defined by claim 20, wherein at least one of the two anti-parallel, series-pair configurations of diodes includes four diodes.

23. An even harmonic mixer as defined by claim 20, wherein the anode of one of the plurality of diodes of at least one of the two anti-parallel, series-pair configurations of diodes and the cathode of at least one other of the plurality of diodes of at least one of the two anti-parallel, series-pair configurations of diodes are coupled to the slotline balun transformer.

24. An even harmonic mixer as defined by claim 20, wherein the radio frequency/intermediate frequency terminal is coupled to the anode of one of the plurality of diodes of at least one of the two anti-parallel, series-pair configurations of diodes and the cathode of at least one other of the plurality of diodes of at least one of the two anti-parallel, series-pair configurations of diodes.

* * * * *